(12) United States Patent
Levanon

(10) Patent No.: US 6,855,441 B1
(45) Date of Patent: Feb. 15, 2005

(54) FUNCTIONALLY IMPROVED BATTERY AND METHOD OF MAKING SAME

(75) Inventor: Baruch Levanon, Kfar Sava (IL)

(73) Assignee: Power Paper Ltd., Kibbutz Einat (IL)

( * ) Notice: Subject to any disclaimer, the term of this patent is extended or adjusted under 35 U.S.C. 154(b) by 0 days.

(21) Appl. No.: 09/958,833

(22) PCT Filed: Apr. 13, 2000

(86) PCT No.: PCT/IL00/00222

§ 371 (c)(1),
(2), (4) Date: Oct. 15, 2001

(87) PCT Pub. No.: WO00/62365

PCT Pub. Date: Oct. 19, 2000

Related U.S. Application Data

(60) Provisional application No. 60/129,234, filed on Apr. 14, 1999.

(51) Int. Cl.[7] .......................... H01M 14/00; H01M 6/00
(52) U.S. Cl. .......................... 429/7; 429/127; 429/124; 429/152; 429/162; 29/623.5; 29/623.1
(58) Field of Search .......................... 429/7, 127, 124, 429/152, 162, 224, 229; 428/209, 210, 688, 701; 604/20, 21, 48, 47, 58

(56) References Cited

U.S. PATENT DOCUMENTS

| | | |
|---|---|---|
| 3,901,732 A | 8/1975 | Kis et al. |
| 4,623,598 A | 11/1986 | Waki et al. |
| 5,059,553 A | 10/1991 | Berndlmaier et al. |
| 5,652,043 A | 7/1997 | Nitzan |
| 5,811,204 A | 9/1998 | Nitzan |
| 5,897,522 A * | 4/1999 | Nitzan .......................... 610/20 |

FOREIGN PATENT DOCUMENTS

JP        6-155866         6/1994

OTHER PUBLICATIONS

Kulesza et al "A Better Bump—Ployner's Promise to Flip Chip Assembly" (1997).

* cited by examiner

Primary Examiner—Patrick Ryan
Assistant Examiner—Angela J. Martin
(74) Attorney, Agent, or Firm—Banner & Witcoff Ltd.

(57) ABSTRACT

A functionally improved battery is disclosed. The battery includes a flexible thin layer open liquid state electrochemical cell (10) and an electronic chip device (60) integrally formed on or within the electrochemical cell (10). The cell (10) includes a first layer of insoluble negative pole (14), a second layer of insoluble positive pole (16) and a third layer of aqueous electrolyte (12). The third layer (12) is disposed between the first (14) and second (16) layers. The third layer (12) includes a diliquescent material for keeping the cell wet, an electroactive soluble material for ionic conductivity and a watersoluble polymer for viscosity. The viscosity adheres the first (14) and second (16) layer to the third layer (12). The chip (60) serves to improve the functionality of the battery.

17 Claims, 6 Drawing Sheets

FUNCTIONALLY IMPROVED BATTERY AND METHOD OF MAKING SAME

This application claims benefit of 60/129,234 filed Apr. 14, 1999.

FIELD AND BACKGROUND OF THE INVENTION

The present invention relates to a functionally improved battery and, more particularly, to a battery which includes a flexible thin layer open liquid state electrochemical cell and an electronic chip device integrally formed on or within the battery, which chip improves a functionality of the battery. The present invention further relates to a method of making a functionally improved battery. Specifically, the functional improvements of the batteries of the present invention increase the useful life (service) of the battery and make the battery a more reliable power source. By reliability, as used herein, is meant that a power output from the battery is less prone to undesired changes over time than a prior art battery.

The ever-growing development of miniaturized and portable electrically powered devices of compact design such as, for example, cellular telephones, voice recording and playing devices, watches, motion and still cameras, liquid crystal displays, electronic calculators, IC cards, temperature sensors, hearing aids, pressure sensitive buzzers, etc., generates an ever-growing need of compact thin layer batteries for their operation. Therefore, there is a need for reliable thin layer electrochemical cells to be used as batteries. Reliability is especially critical in, for example, sensitive medical equipment and communication devices.

Batteries can be broadly classified into two categories in which the batteries of the first category include wet electrolytes (i.e., liquid state batteries), whereas batteries of the second category include a solid state electrolyte. Although solid state batteries have an inherent advantage, they do not dry out and do not leak, they suffer major disadvantages when compared with liquid state batteries since, due to limited diffusion rates of ions through a solid, their operation is temperature dependent to a much larger extent, and many operate well only under elevated temperatures; and, the limited diffusion rates thus described, characterize solid state batteries with low ratio of electrical energy generated vs. their potential chemical energy.

Liquid state thin layer batteries typically include a positive and negative active insoluble material layer put together with a separator interposed therebetween, which separator is soaked with a liquid electrolyte solution, thus functioning as an electrolytic liquid layer. Such batteries, an example of which is disclosed in U.S. Pat. No. 4,623,598 to Waki et al., and in Japanese Pat. No. JP 61-55866 to Fuminobu et al., have to be sealed within a sheathing film to prevent liquid evaporation, and are therefore closed electrochemical cells. Being closed cells, these batteries tend to swell upon storage due to evolution of gases which is a fatal problem in thin layer batteries having no mechanical support, the pressure imposed by the accumulated gases leads to layer separation, thus turning the battery inoperative. Means to overcome this problem include (i) the use of a polymer increased viscosity agent, such as hydroxyethylcellulose, applied to adhere (i.e., glue) the battery layers together, thus to overcome the inherent problem of such batteries imposed by lack of solid support; and, (ii) addition of mercury to prevent the formation of gases, especially hydrogen. However, the polymer is limited in its effectiveness and the mercury is environmentally hazardous.

A way to solve the above described limitation was disclosed in U.S. Pat. No. 3,901,732 to Kis et al. in which a gas-permeable electrolyte-impermeable polymeric material which allows venting of undesirable gases formed within the battery while preventing any electrolyte loss from the battery is used as a sheathing film to enclose the battery cell.

However, a more direct and efficient way to avoid undesired gas accumulation in liquid state thin layer batteries is to provide these batteries as open cells for facilitated release of gases, while at the same time to The structure, manufacture and integration into electronic applications of such a flexible thin layer open liquid state electrochemical cell are described in detail in U.S. Pat. Nos. 5,652,043; 5,811,204 and 5,897,522, all to Nitzan, which are incorporated by reference as if fully set forth herein.

A disadvantage shared by all battery types is that use of the battery after the voltage of the cell(s) drops below the minimum required level for the device operated thereby is infeasible. Generally, a potential difference between the poles of the battery still exists at this point. It is therefore desirable to attach an external chip device to the battery to allow utilization of this power.

The attachment of chips to printed circuit boards (PCB) may be effected by welding or by what is known as a flip-chip technology.

Welding requires heating of metal contacts on both the PCB and the chip device to fuse them to a connecting conductive wire, typically a gold wire or an aluminum wire. The process is technically complex, requires the use of welding ultrasound welding devices, and the input materials are expensive. As a result, the welding option is commercially unattractive with respect to battery manufacture.

Flip chips, for example of the type disclosed in U.S. Pat. No. 5,059,553 which is fully incorporated herein by reference, rely upon the use of conductive protrusions or bumps which can fuse to a chip device when heat or pressure are applied. This technology is easier to implement than welding and is commercially more desirable. Recent advances in flipchip technology include, but are not limited to, the use of polymer flip-chips as described in F. Kuleza and R. Estes (1997) "A Better Bump: Polymer's Promise to Flip Chip Assembly" Advanced Packaging, HIS Publishing which is fully incorporated herein by reference.

Neither welding nor flip-chip technology were so far employed with batteries so as to form a battery having an integral chip thereon.

There is thus a widely recognized need for, and it would be highly advantageous to have, a functionally improved battery having an integrated chip so as to improve its functionality.

SUMMARY OF THE INVENTION

According to one aspect of the present invention there is provided a functionally improved battery functionally improved battery comprising. (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity, and (iii) a water-soluble polymer for obtaining a required viscosity for adhering said first and second layers to said third layer; said flexible thin layer open liquid state electrochemical cell including external terminals electrically connected to said first and second pole layers for making electrical connections to said electrochemical cell; and (b) an electronic chip device including an electrical circuit for performing one or more functions, and external terminals for making electrical connection thereto; said electronic chip device being integrally formed on or within said flexible thin layer open liquid state electrochemical cell with said external terminals of the electronic chip device directly bonded to the external terminals of said electrochemical cell.

According to another aspect of the present invention, there is provided a method of making a functionally improved battery, comprising: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; (iii) applying onto said second side a layer of positive pole; (iv) forming on said electrochemical cell external terminals electrically connected to said negative and positive poles, respectively (b) applying on or in said flexible thin layer open liquid state electrochemical cell an electronic chip device including an electrical circuit for performing one or more functions, and external terminals for making electrical connections thereto; and (c) bonding said external terminals of the electronic chip device to said external terminals of the electrochemical cell, such that the electronic chip device is integrally formed on or within said electrochemical cell.

According to further features in preferred embodiments of the invention described below, the first layer of insoluble positive pole includes manganese-dioxide powder and the second layer of insoluble negative pole includes zinc powder.

According to still further features in the described preferred embodiments, the electroactive soluble material is selected from the group consisting of zinc-chloride, zinc-bromide, zinc-fluoride and potassium-hydroxide.

According to still further features in the described preferred embodiments, the first layer of insoluble negative pole includes silver-oxide powder and the second layer of insoluble positive pole includes zinc powder.

According to still further features in the described preferred embodiment, the electroactive soluble material is potassium-hydroxide.

According to still further features in the described preferred embodiments, the first layer of insoluble negative pole includes cadmium powder and the second layer of insoluble positive pole includes nickel-oxide powder.

According to still further features in the described preferred embodiments, the electroactive soluble material is potassium-hydroxide.

According to still further features in the described preferred embodiments, the first layer of insoluble negative pole includes iron powder and the second layer of insoluble positive pole includes nickel-oxide powder.

According to still further features in the described preferred embodiments, the electroactive soluble material is potassium-hydroxide.

According to still further features in the described preferred embodiments, the first layer of insoluble negative pole and the second layer of insoluble positive pole include lead-oxide powder, the cell is charged by voltage applied to the poles.

According to still further features in the described preferred embodiments, the electroactive soluble material is sulfuric-acid.

According to still further features in the described preferred embodiments, the deliquescent material and the electroactive soluble material are the same material.

According to still further features in the described preferred embodiments, the same material is selected from the group consisting of zinc-chloride, zinc-bromide, zinc-fluoride and potassium-hydroxide.

According to still further features in the described preferred embodiments, the deliquescent material is selected from the group consisting of calcium-chloride, calcium-bromide, potassium-biphosphate and potassium-acetate.

According to still further features in the described preferred embodiments, the water-soluble polymer is selected from the group consisting of polyvinylalcohol, poliacrylamide, polyacrylic acid, polyvinylpyrolidone, polyethylenoxide, agar, agarose, starch, hydroxyethylcellulose and combinations and copolymers thereof.

According to still further features in the described preferred embodiments, the water-soluble polymer and the deliquescent material are the same material.

According to still further features in the described preferred embodiments, the same material is selected from the group consisting of dextrane, dextranesulfate and combinations and copolymers thereof.

According to still further features in the described preferred embodiments, the battery further comprises terminals, each of the terminals being in electrical contact with one of the first and second pole layers.

According to still further features in the described preferred embodiments, wherein the terminals are made of graphite.

According to still further features in the described preferred embodiments, the battery further comprises at least one conductive layer improving the electronic conductivity of at least one of the first and second pole layers.

According to still further features in the described preferred embodiments, the conductive layer is selected from the group consisting of a graphite paper and carbon cloth.

According to still further features in the described preferred embodiments, the battery further comprises an external layer selected from the group consisting of an adhesive backing layer, a lamina protective layer and a combination of adhesive backing layer and a lamina protective layer.

According to still further features in the described preferred embodiments, there is provided an electrical power supply comprising two functionally improved batteries according to claim 1, wherein the cells are connected in a head to tail orientation in a bipolar-connection.

According to still further features in the described preferred embodiments, the connection is by an adhesive selected from the group consisting of a conductive double sided adhesive tape and a conductive glue layer.

According to still further features in the described preferred embodiments, wherein the conductive double sided adhesive tape and the conductive glue layer are applied by a printing technology.

According to still further features in the described preferred embodiments, the electronic chip device serves to convert an output of the battery from DC to AC.

According to still further features in the described preferred embodiments, the electronic chip device serves to facilitate charging of the battery from an external power supply.

According to still further features in the described preferred embodiments, the electronic chip device serves to keep a DC output of the battery constant over time.

According to still further features in the described preferred embodiments, the electronic chip device serves to allow selection of a constant DC output from among at least two DC outputs.

According to still further features in the described preferred embodiments, the electronic chip device serves to allow selection of a constant DC output selected from the group consisting of 1.5 volts, 3.0 volts, 4.5 volts, 6.0 volts, 7.5 volts, 9 volts and 12 volts.

According to still further features in the described preferred embodiments, wherein the electronic chip device serves to allow selection of an operational mode from among at least two operational modes.

According to still further features in the described preferred embodiments, one of the at least two operational modes is a sleep mode for low battery drain.

According to still further features in the described preferred embodiments, the battery further comprises a status indicator.

According to still further features in the described preferred embodiments, the wetting is by a dipping technology.

According to still further features in the described preferred embodiments, the wetting is by a printing technology.

According to still further features in the described preferred embodiments, the layers of negative and positive poles include active insoluble powder materials mixed with the deliquescent material, electroactive soluble material and water-soluble polymer.

According to still further features in the described preferred embodiments, the application of the layers of negative and positive poles is by a printing technology.

According to still further features in the described preferred embodiments, the electronic chip device is applied on or in the flexible thin to layer open liquid state electrochemical cell by a method selected from the group consisting of welding and flip-chip addition.

The present invention successfully addresses the shortcomings of the presently known configurations by providing a battery with an increased useful life and a power output which is more nearly constant over a prolonged service. The present invention further provides a battery which has a selectable power output.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

Figure 1:
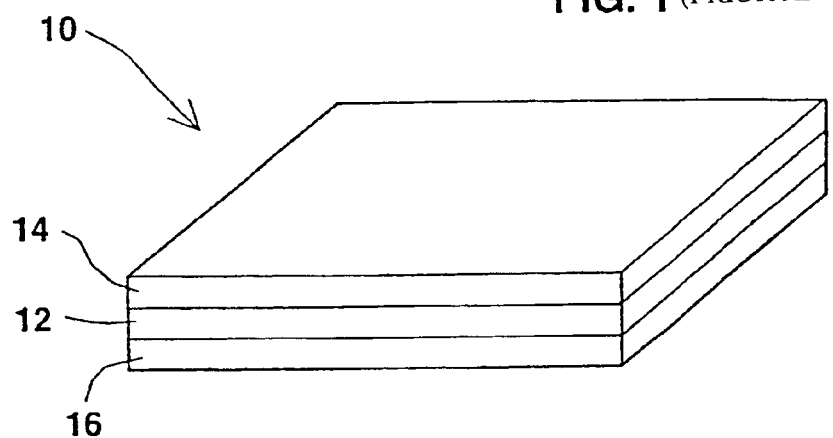
FIG. 1 is a perspective view of a prior art configuration of a flexible thin layer open electrochemical cell as described in U.S. Pat. Nos. 5,652,043; 5,811,204 and 5,897,522.

The present invention is of a functionally improved battery which includes a flexible thin layer open electrochemical cell which can be used as a primary or rechargeable power supply for various miniaturized and portable electrically powered devices of, for example, compact design, short use and/or disposable nature. The flexible thin layer open electrochemical cell of the present invention includes a wet electrolyte, yet maintains a flexible, thin and open configuration, thus is devoid of accumulation of gases upon storage. In addition it is equipped with an integral electronic chip device which improves its functionality during service and/or prolongs the batteries lifetime.

The principles and operation of a flexible thin layer open electrochemical cell employed as part of the present invention may be better understood with reference to the drawings and accompanying descriptions.

Before explaining at least one embodiment of the invention in detail, it is to be understood that the invention is not limited in its application to the is details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Referring now to the drawings, FIG. 1 illustrates a basic configuration of a flexible thin layer open electrochemical cell, generally designated 10. Cell 10 includes three layers as follows. A first layer of insoluble negative pole 14, a second layer of insoluble positive pole 16 and a third layer of aqueous electrolyte 12. As used in this document, on discharged negative pole is where an oxidation occurs, whereas the positive pole is where reduction occurs. The aqueous electrolyte layer 12 includes a deliquescent (i.e., hygroscopic) material for keeping open cell 10 wet at all times; an electroactive soluble material for obtaining the required ionic conductivity and a water-soluble polymer for obtaining the required viscosity for adhering pole layers 14 and 16 to aqueous electrolyte layer 12. Following is a more detailed description of each of layers 14, 16 and 12 and their role in open cell 10 operation.

The aqueous electrolyte layer 12 typically includes a porous insoluble substance, such as but not limited to, filter paper, plastic membrane, cellulose membrane, cloth, etc., the porous substance is wetted by an aqueous solution including three components: a deliquescent material; an electroactive soluble material; and a water-soluble polymer.

The deliquescent material by being hygroscopic maintains cell 10 moisturized at all times. The level of moisture within open cell 10 may vary depending on deliquescent material selection, its concentration and air humidity. Suitable deliquescent materials include, but are not limited to, calcium-chloride, calcium-bromide, potassium-biphosphate, potassiumacetate and combinations thereof.

The electroactive soluble material is selected in accordance with the materials of which the negative and positive pole layers are made. A list of frequently used electroactive soluble materials suitable for the present invention includes for example zinc-chloride, zinc-bromide and zinc-fluoride for various primary cells and potassium-hydroxide and sulfuric-acid for rechargeable cells. The water-soluble polymer is employed as an adhesive agent to adhere (e.g., glue) pole layers 14 and 16 to the aqueous electrolyte layer 12. Many types of polymers are suitable ones, such as for example polyvinylalcohol, poliacrylamide, polyacrylic acid. polyvinylpyrolidone, polyethylenoxide, agar, agarose, starch, hydroxyethylcellulose and combinations and copolymers thereof.

Each of negative and positive pole layers 14 and 16 includes a mix of a suitable (negative or positive, respectively) active insoluble powder material with an aqueous solution similar to the solution described hereinabove, including a deliquescent material; an electroactive soluble material; and a water-soluble polymer.

It is clear to those with skills in the art that while the electroactive soluble material should not change, the deliquescent material and the water-soluble polymer may be selected otherwise in the later solution, in other words, the electroactive soluble material should be kept the same in all three layers 12, 14 and 16, whereas the deliquescent material and the water-soluble polymer may be varied between layers according to the specific application.

Appropriate selection of active insoluble powder materials for the negative 14 and positive 16 pole layers with a matching electroactive soluble material, as exemplified hereinbelow in the Examples, provides flexible thin layer cell 10 which can be used as a power supply (i.e., a battery), which cell 10 is open and therefore does not accumulate gases upon storage, yet the hygroscopicality of the deliquescent material ensures that cell 10 is kept wet at all times although open. Suitable pairs of materials to be used in negative 14 and positive 16 poles include, but are not limited to, manganese-dioxide/zinc; silver-oxide/zinc; cadmium/nickel-oxide: and iron/nickel-oxide (the manganese-dioxide and the silver-oxide are optionally mixed with a conductive carbon powder as known in the art).

It is clear to those with skills in the art that a single material may function both as a deliquescent material and as the electroactive soluble material. Such a material should however acquire suitable electroactive and hygroscopic characteristics. Suitable materials of this type include, but are not limited to, zinc-chloride and zinc-bromide.

It is further clear to those with skills in the art that a single material may function as a deliquescent material and as a water-soluble polymer. Such a material should however acquire suitable hygroscopic and adhesivness characteristics. Suitable materials of this type include, but are not limited to, dextrane, dextranesulfate and combinations and copolymers thereof.

The three layers 12, 14 and 16, presented in FIG. 1 and described hereinabove may be manufactured thin and are flexible, therefore cell 10 is flexible and as thin as 0.5–1.5 mm or less. It is presently preferred and will be further detailed below that cell 10 will be manufactured by a suitable printing technology. Suitable printing technologies include, but are not limited to, silk print, offset print, jet printing, lamination, materials evaporation and powder dispersion.

Figure 2:
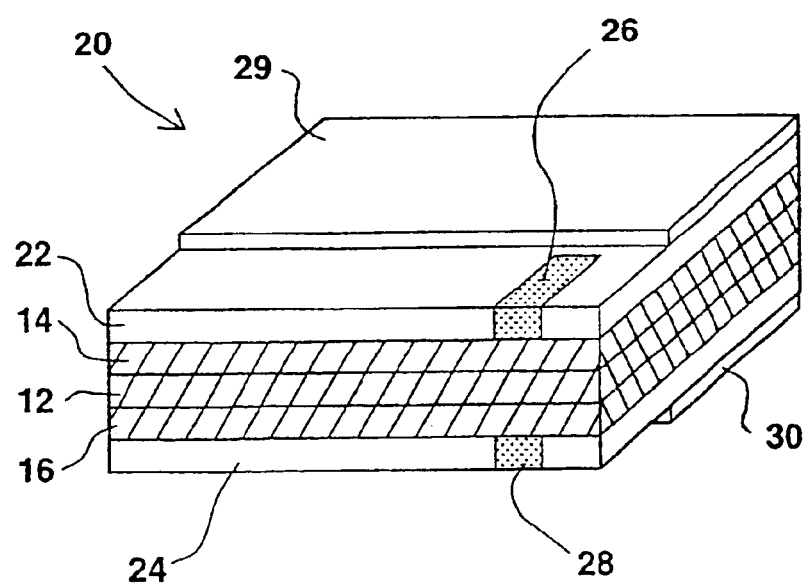
FIG. 2 is a perspective view of another possible prior art configuration of a flexible thin layer open electrochemical cell as described in U.S. Pat. Nos. 5,652,043; 5,811,204 and 5,897,522.

Another possible configuration is shown in FIG. 2 illustrating a cell. generally assigned 20. As cell 10, cell 20 also includes layers 12, 14 and 16 (stripped region) forming a basic cell. Cell 20 further includes additional one or two conductive layers 22 and 24, to improve the electronic conductivity of negative 14 and/or positive 16 pole layers. Suitable conductive layers are graphite paper, carbon cloth, etc. Cell 20 also includes negative 26 and positive 28 terminals, which terminals 26 and 28 are in electrical contact with either the corresponding pole layer 14 and 16, respectively, or with the corresponding conductive layer 22 and 24, respectively, or both. Terminals 26 and 28 are made of ants suitable materials such as, but not limited to, graphite or metals such as iron, nickel, titanium, copper, stainless steel and mixtures thereof, and are preferably applied to cell 20 by a suitable printing technology such as the ones listed above. Terminals 26 and 28 are used to electrically connect cell 20 to a load such as an electrically powered device. Terminals 26 and 28 may be located in any desired location of cell 20, may acquire any suitable shape and size and, depending on the specific application, terminals 26 and 28 may protrude from the surface of cell 20. Cell 20 may further include at least one externally located adhesive backing 29, to enable attaching cell 20 to various surfaces, and/or at least one externally located lamina protective layer 30 to physically protect all other layers.

Figure 3A:
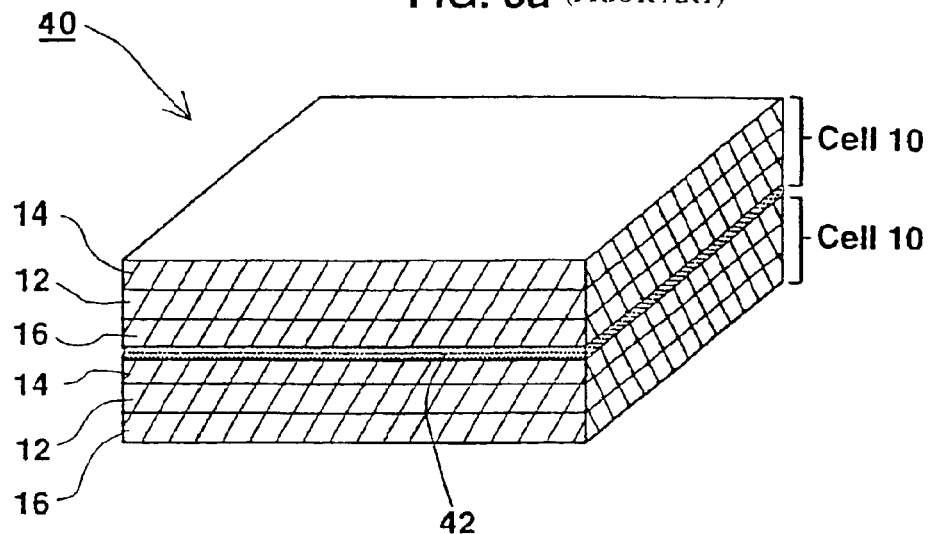
FIGS. 3a and 3b are perspective views of two prior art possible configurations of power supplies formed by a bi-polar connection of two cells of FIG. 1 and FIG. 2, respectively, to additively increase the electrical energy obtained of thus formed electrical power supplies, as described in U.S. Pat. Nos. 5,652,043; 5,811,204 and 5,897,522.
Figure 3B:
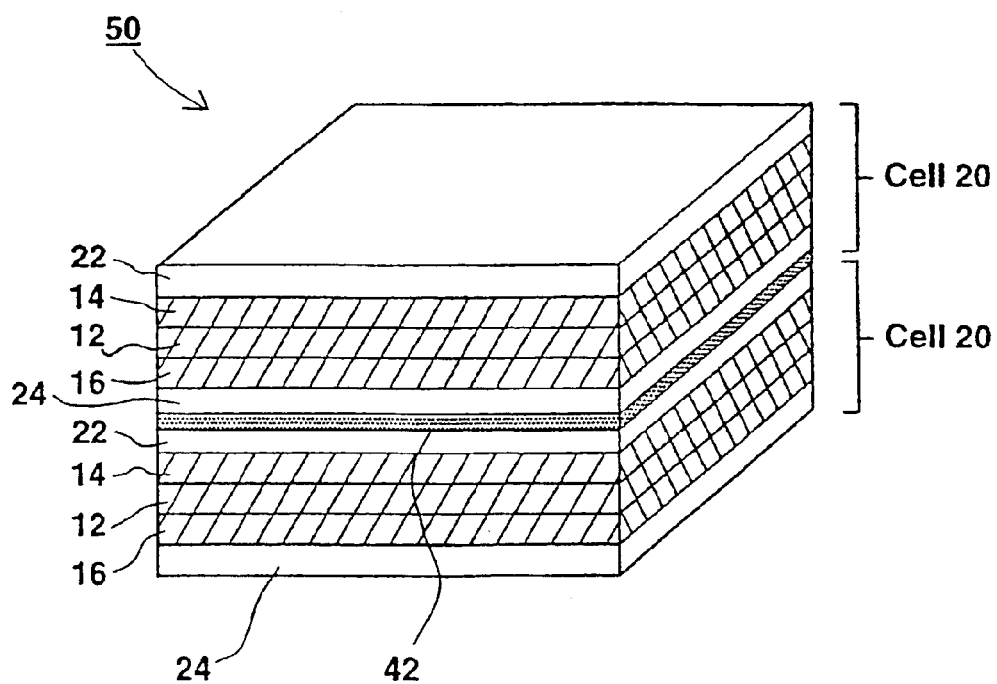
Figure 4:
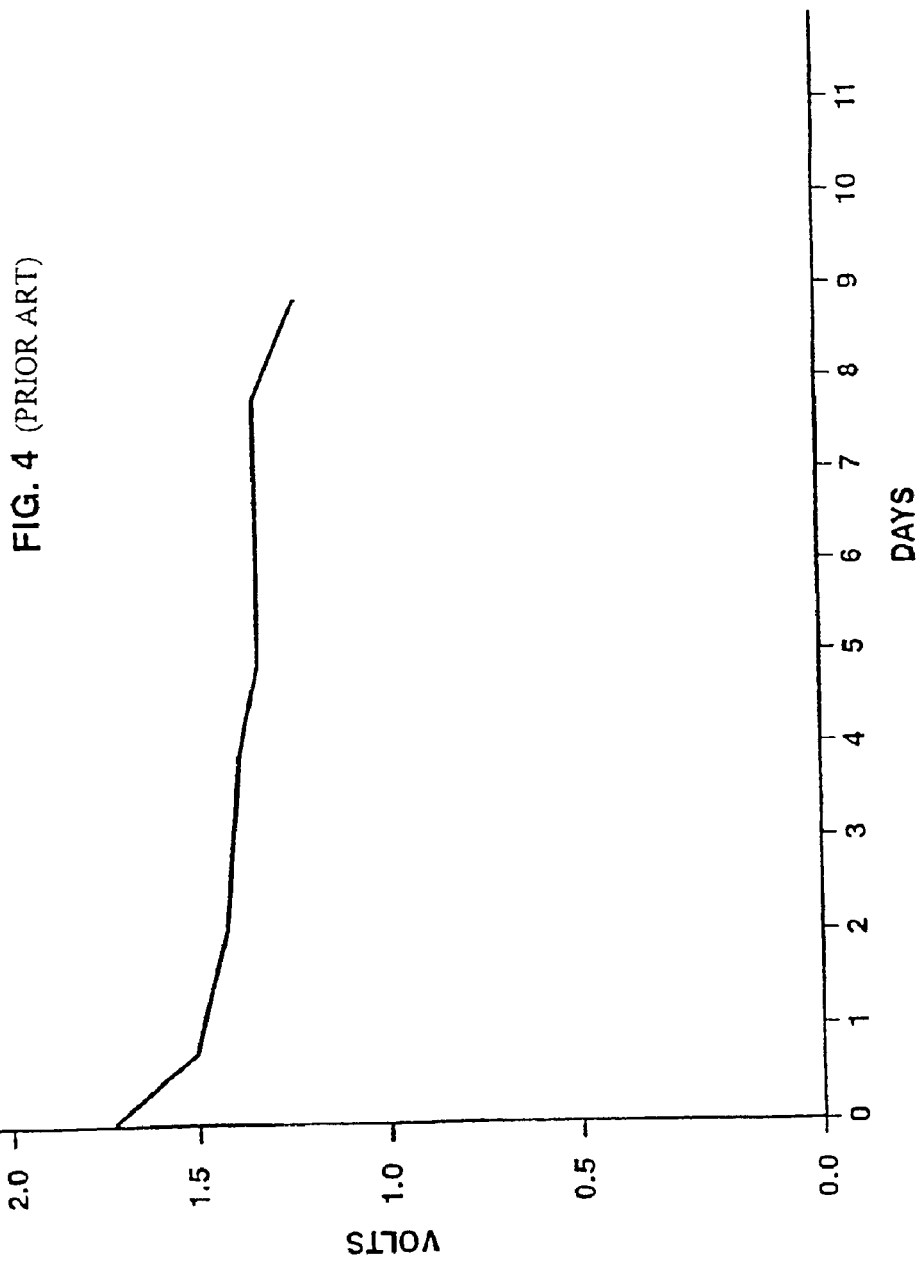
FIG. 4 is a graph presenting the voltage of a prior art flexible thin layer open electrochemical cell as described in U.S. Pat. Nos. 5,652,043; 5,811,204 and 5,897,522, as measured by a voltmeter, as function of time, under room conditions.

Yet another configuration is shown in FIGS. 3a–b. Two or more cells 10, as shown in FIG. 3a, or cells 20, as shown in FIG. 3b, may be electrically connected by a bi-polar connection to additively increase the electrical energy obtained of thus formed electrical power supplies 40 and 50, respectively. For this purpose two or more cells are adhered to one another in a head to tail orientation, as indicated in FIGS. 3a–b by layers 22, 14, 12, 16 and 24 arrangement, by a conductive double sided adhesive tape, or a conductive glue layer 42 applied for example by a suitable printing technology, enabling passage of electrons between adjacent cells. It is clear that electrical power supplies 40 and/or 50 may further include externally located adhesive backing(s) similar to surface 29 of FIG. 2 and/or externally located lamina protective layer(s), similar to layer 30 of FIG. 2. It is further clear that electrical power supplies 40 and 50 may include a and a positive terminal similar to terminals 26 and 28, respectively, of FIG. 2.

The present invention further includes a method of making a functionally improved battery. The method comprises the steps of producing a flexible thin layer open liquid state electrochemical cell and applying thereupon or therein an electronic chip device, shown at 60 in FIGS. 5 and 6. to improve a functionality of the battery. Production of the electrochemical cell is accomplished in three steps. The first step is wetting a porous substance having a first side and a second side with an aqueous solution containing a deliquescent material, an electroactive soluble material and a water-soluble polymer. The second step is applying onto the first side a layer of negative pole. The third step is applying onto the second side a layer of positive pole. The negative and positive pole layers include active insoluble powder substances mixed with the deliquescent material, electroactive soluble material and water-soluble polymer preferably of the same types as above, and are preferably applied using a suitable printing technology selected for example from the ones listed above.

The method may further include adding to the cell additional layers and parts, such as but not limited to, externally located adhesive backing(s) and/or lamina protective layer (s), and negative and a positive terminals. Yet, the method may further include bi-polar joining of two or more cells, for example with a conductive double sided adhesive tape or a conductive glue layer applied for example by a suitable printing technology, to form a power supply with an increased power (e.g., substantially doubled, tripled, etc.). According to the present invention such bi-polar joining may be performed by joining together in a head to tail orientation two or more premanufactured cells, or alternatively, directly manufacturing two or more cells thus oriented, by applying suitable layer one after the other, preferably using a suitable printing technology as described above.

As indicated above, the electronic chip device 60 may be integrally formed on or within the flexible thin layer open liquid state electrochemical cell by the known flip-chip or welding techniques. For example, U.S. Pat. No. 5,059,553, previously incorporated herein by reference, provides the external terminals, on the two devices to be integrated, in the form of conductive protrusions or bumps which are bonded together by heat and pressure. Accordingly, when using this technique in the present invention, the external terminals 26, 28 electrically connected to the two pole layers of the electrochemical cell, and the corresponding electrical terminals on the electronic chip device 60 electrically connected to the electrical circuit of the chip device, would be bonded together by heat and pressure or by welding to integrally form the electronic chip device on or within the electrochemical cell.

Figure 5A:
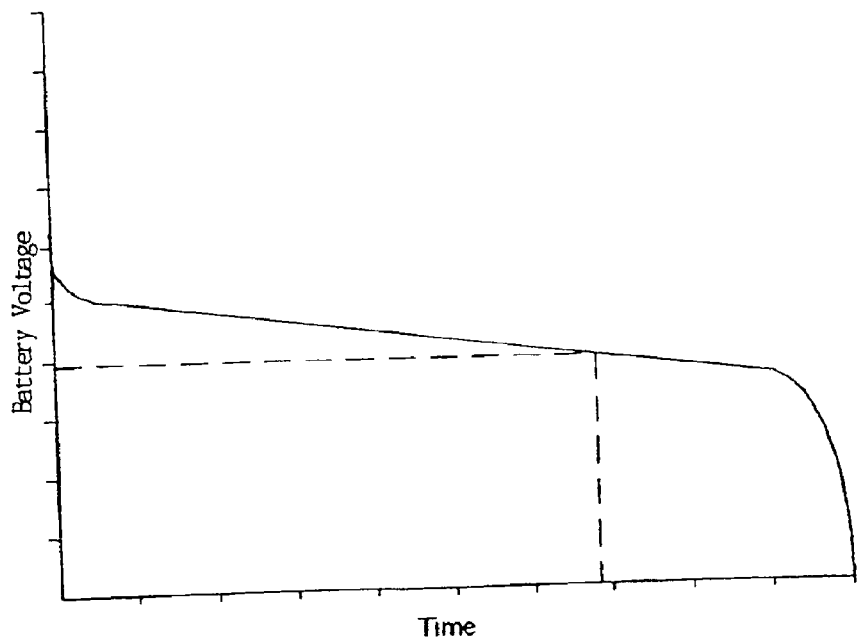
FIGS. 5a and 5b are graphs of output voltage as a function of time for a prior art battery and a battery provided with a chip according to the present invention, respectively.
Figure 5B:
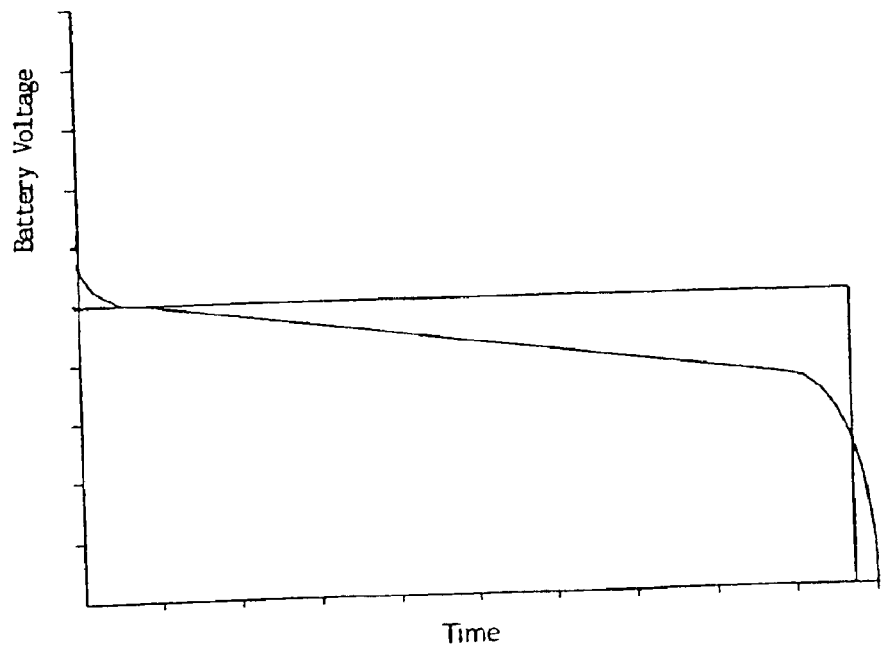
Figure 6:
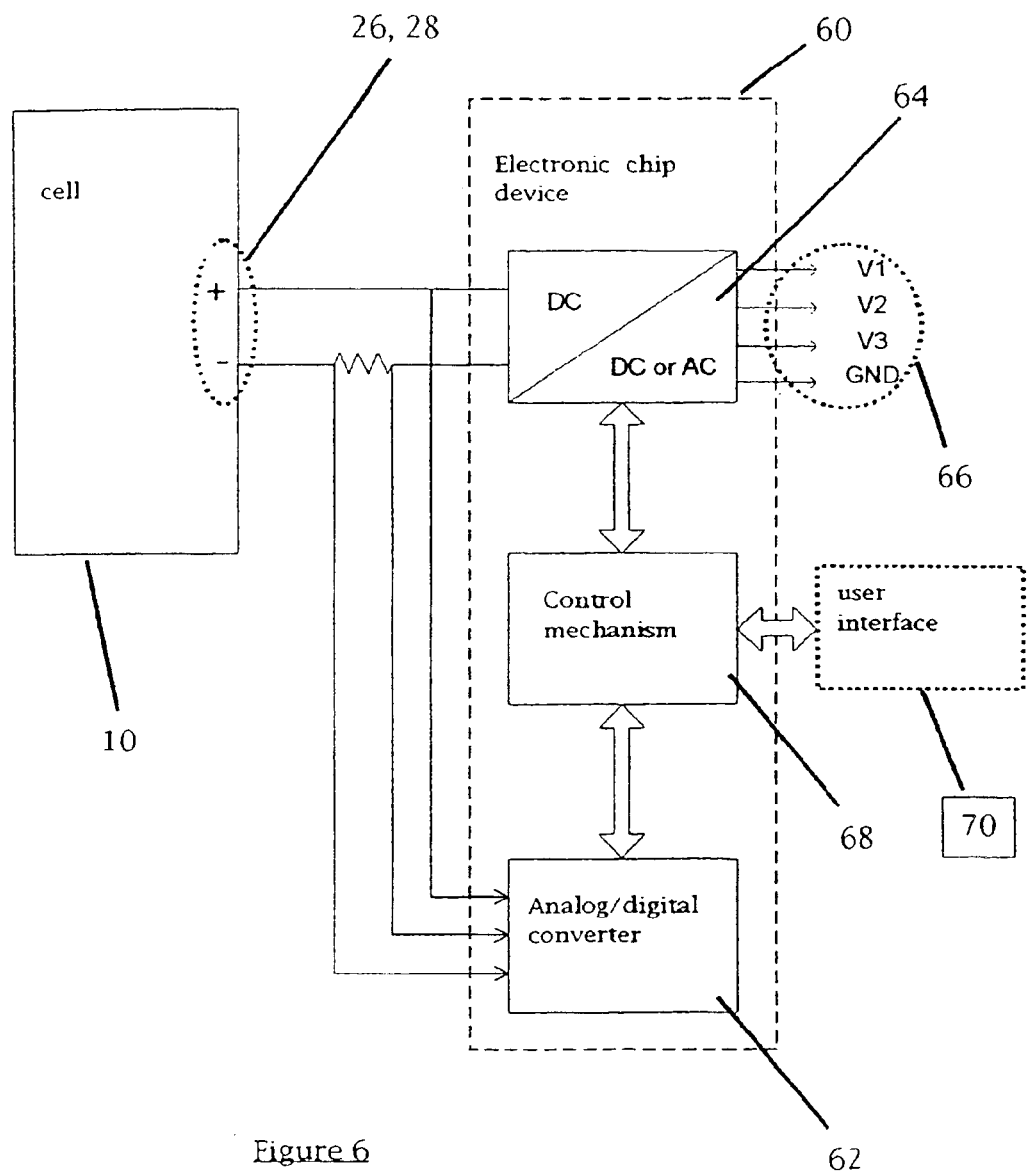
FIG. 6 is a schematic diagram showing relationship of components of a battery according to the present invention.

The functionally improved battery of the present invention offers several advantages over prior art batteries. The greatest advantage is a longer useful life with a DC output which is more nearly constant over time (FIGS. 5a–b). Regulation of the power output by electronic chip device 60 makes the battery of the present invention less prone to deviations in voltage from temperature changes or aging of the battery. This makes the battery of the present invention uniquely suited to use in smart cards and personal medical telemetry applications. In addition, the battery of the present invention is capable of converting an output of the battery from DC to AC by virtue of electronic chip device 60 which may contain, for example an AC/DC transformer 64 (FIG. 6). Arrows in FIG. 6 indicate channels of communication and/or flows of electric current. Chip device 60 may be attached to cell 10 by, for example, welding or flip-chip technology. One ordinarily skilled in the art will be capable of modifying the production process for cell 10 so that suitable contact points for attachment of chip 60 are produced during manufacture. Integral formation of chip 60 on or within cell 10 can then be accomplished as part of the initial manufacturing process, or as a separate procedure conducted at a later time. The scope of the present invention therefore includes both batteries with suitable contact points for attachment of chip 60 on cell 10, and any post manufacture procedure conducted to attach chip 60 to such a battery.

According to a preferred embodiment of the present invention, the electronic chip device 60 serves to facilitate charging of the battery from an external power supply by means of a transformer 64. In this case, transformer 64 is typically an AC to DC step down transformer so that the battery may be charged by an AC power source, for example, a household electrical outlet (wall socket). This feature eliminates the need for a separate charging device.

According to another preferred embodiment of the present invention, the electronic chip device serves to allow selection of a constant DC output from among at least two DC outputs 66 by means of a user interface 70 and a control mechanism 68. These outputs may be, for example, discrete outputs, such as, but not limited to, 1.5 volts, 3.0 volts, 4.5 volts, 6.0 volts, 7.5 volts, 9 volts and 12 volts. Alternatively, a range of gradually increasing outputs, for example 1.5 to 12 volts might be available.

According to yet another preferred embodiment of the present invention, the electronic chip device serves to allow selection of an operational mode from among at least two operational modes. One of the at least two operational modes may be, for example, a sleep mode for low battery drain. Selection is via a user interface 70 which is in indirect communication with transformer 64 and an analog/digital converter 62 via a control mechanism 68.

Figure 7:
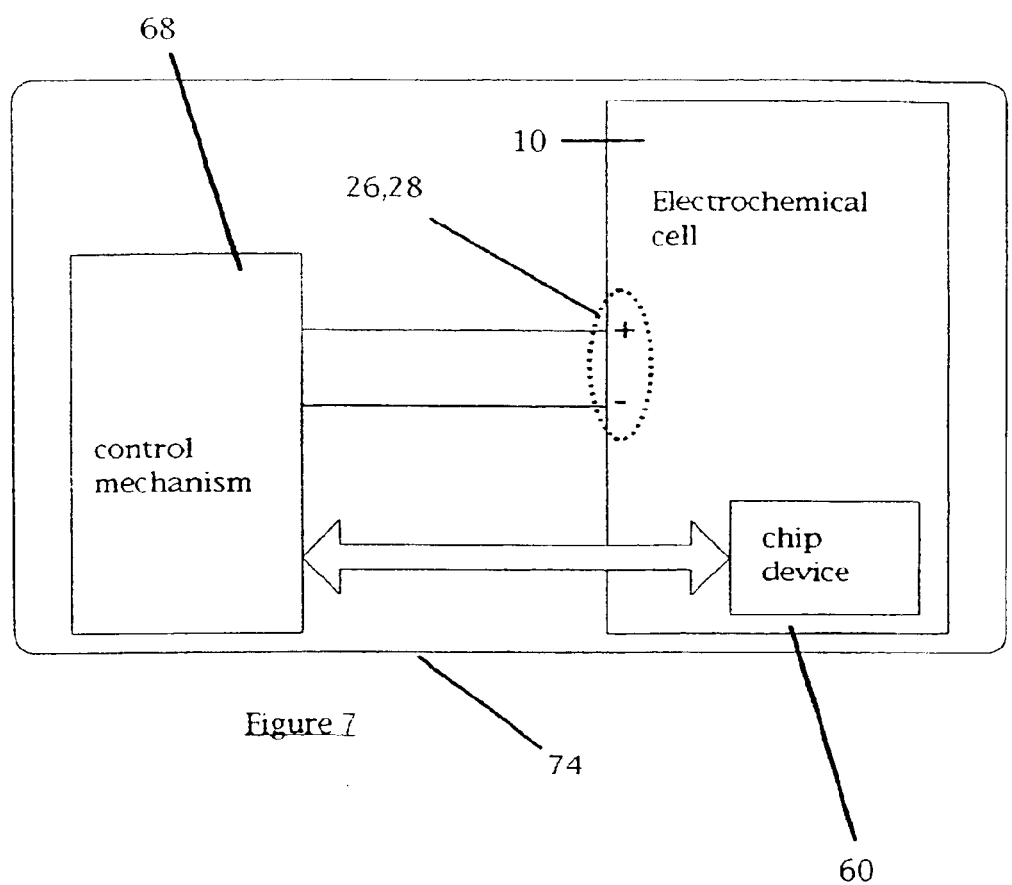
FIG. 7 is a schematic diagram showing an alternate preferred embodiment with control of a battery according to the present invention by an external control device.

According to still another preferred embodiment of the present invention, the battery further comprises a status indicator as part of user interface 70. The status indicator may display, for example, remaining battery life in hours, operational mode, selected output power and AC or DC output. Display may be by means of, for example, an LCD display an LED display or a reversible electrochemical reaction which produces a visible color change. Alternately or additionally, at least a portion of the selection and display features described herein may be effected by an external control mechanism 68 (FIG. 7) which is part of a device 74 operated by the battery of the present invention. Installation of the battery in device 74 establishes communication between control mechanism 68 and chip device 60 as is indicated by a hollow arrow.

Although the invention has been described in conjunction with specific embodiments thereof, it is evident that man), alternatives, modifications and variations will be apparent to those skilled in the art. Accordingly, it is intended to embrace all such alternatives. modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A functionally improved battery comprising: (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity; and (iii) a water-soluble polymer for obtaining a required viscosity for adhering said first and second layers to said third layer; and (b) an electronic chip device being integrally formed on or within said flexible thin layer open liquid state electrochemical cell, said electronic chip device serving to improve a functionality of the battery wherein said electronic chip device serves to convert an output of the battery from DC to AC.

2. A functionally improved battery comprising: (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity; and (iii) a water-soluble polymer for obtaining a required viscosity for adhering said first and second layers to said third layer; and (b) an electronic chip device being integrally formed on or within said flexible thin layer open liquid state electrochemical cell, said electronic chip device serving to improve a functionality of the battery wherein said electronic chip device serves to facilitate charging of the battery from an external power supply.

3. A functionally improved battery comprising: (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity; and (iii) a water-soluble polymer for obtaining a required viscosity for adhering said first and second layers to said third layer and (b) an electronic chip device being integrally formed on or within said flexible thin layer open liquid state electrochemical cell, said electronic chip device serving to improve a functionality of the battery wherein said electronic chip device serves to keep a DC output of the battery constant over time.

4. A functionally improved battery comprising: (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity; and (iii) a water-soluble polymer for obtaining a required viscosity for adhering said first and second layers to said third layer; and (b) an electronic chip device being integrally formed on or within said flexible thin layer open liquid state electrochemical cell, said electronic chip device serving to improve a functionality of the battery wherein said electronic chip device serves to allow selection of a constant DC output from among at least two DC outputs.

5. The functionally improved battery of claim 4, wherein said electronic chip device serves to allow selection of a constant DC output selected from the group consisting of 1.5 volts, 3.0 volts, 4.5 volts, 6.0 volts, 7.5 volts, 9 volts and 12 volts.

6. A functionally improved battery comprising: (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity; and (iii) a water-soluble polymer for obtaining a required viscosity for adhering said first and second layers to said third layer; and (b) an electronic chip device being integrally formed on or within said flexible thin layer open liquid state electrochemical cell, said electronic chip device serving to improve a functionality of the battery wherein said electronic chip device serves to allow selection of an operational mode from among at least two operational modes.

7. The functionally improved battery of claim 6, wherein one of said at least two operational modes is a sleep mode for low battery drain.

8. A functionally improved battery comprising: (a) a flexible thin layer open liquid state electrochemical cell including a first layer of insoluble negative pole, a second layer of insoluble positive pole and a third layer of aqueous electrolyte, said third layer being disposed between said first and second layers and including: (i) a deliquescent material for keeping the open cell wet at all times; (ii) an electroactive soluble material for obtaining required ionic conductivity; and (iii) a water-soluble polymer for obtaining a required viscosity for adhering said first and second layers to said third layer; and (b) an electronic chip device being integrally formed on or within said flexible thin layer open liquid state electrochemical cell, said electronic chip device serving to improve a functionality of the battery further comprising a status indicator.

9. A method of making a functionally improved battery, the method comprising the steps of: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use wherein said electronic chip device facilitates conversion of an output of the battery from DC to AC.

10. A method of making a functionally improved battery, the method comprising the steps of: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use wherein said electronic chip device facilitates charging of the battery from an external power supply.

11. A method of making a functionally improved battery, the method comprising the steps of: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use wherein said electronic chip device facilitates keeping a DC output of the battery constant over time.

12. A method of making a functionally improved battery, the method comprising the steps of: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use wherein said electronic chip device facilitates selection of a constant DC output from among at least two DC outputs.

13. The method of claim 12, wherein said electronic chip device facilitates selection of a constant DC output selected from the group consisting of 1.5 volts, 3.0 volts, 4.5 volts, 6.0 volts, 7.5 volts, 9 volts and 12 volts.

14. A method of making a functionally improved battery the method comprising the steps of, (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use wherein said electronic chip device facilitates selection of an operational mode from among at least two operational modes.

15. The method of claim 14, wherein one of said at least two operational modes is a sleep mode for low battery drain.

16. A method of making a functionally improved battery, the method comprising the steps of: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use further comprising the step of incorporating a status indicator into the battery.

17. A method of making a functionally improved battery, the method comprising the steps of: (a) producing a flexible thin layer open liquid state electrochemical cell by performing the substeps of: (i) wetting a porous substance having a first side and a second side with an aqueous solution containing a deliquescent material, an electroactive soluble material and a water-soluble polymer; (ii) applying onto said first side a layer of negative pole; and (iii) applying onto said second side a layer of positive pole; and (b) applying on or in said flexible thin layer open liquid state electrochemical cell an electronic chip device to improve a functionality of the battery when in use wherein said electronic chip device is applied on or in said flexible thin layer open liquid state electrochemical cell by a method selected from the group consisting of welding and flip-chip addition.

* * * * *